(12) United States Patent
Koseki et al.

(10) Patent No.: US 8,242,524 B2
(45) Date of Patent: Aug. 14, 2012

(54) LIGHT EMITTING DEVICE

(75) Inventors: Masakata Koseki, Aichi-ken (JP); Eiki Kawano, Aichi-ken (JP)

(73) Assignee: Toyoda Gosei Co., Ltd., Nishikasugai-Gun, Aichi-Ken (JP)

( * ) Notice: Subject to any disclaimer, the term of this patent is extended or adjusted under 35 U.S.C. 154(b) by 0 days.

(21) Appl. No.: 12/458,827

(22) Filed: Jul. 23, 2009

(65) Prior Publication Data

US 2010/0025709 A1 Feb. 4, 2010

(30) Foreign Application Priority Data

Jul. 29, 2008 (JP) ................................ 2008-194903

(51) Int. Cl.
*H01L 33/00* (2010.01)
(52) U.S. Cl. .................. 257/98; 257/100; 257/E33.059
(58) Field of Classification Search ................... 257/98, 257/79, 76, 100; 313/506, 112, 501; 336/96
See application file for complete search history.

(56) References Cited

U.S. PATENT DOCUMENTS

| | | | |
|---|---|---|---|
| 6,791,259 B1 | 9/2004 | Stokes et al. | |
| 6,936,852 B2 | 8/2005 | Furukawa et al. | |
| 7,176,623 B2 | 2/2007 | Nitta et al. | |
| 7,309,881 B2 | 12/2007 | Sato et al. | |
| 7,847,662 B2 * | 12/2010 | Saito et al. | 336/96 |
| 2005/0156517 A1 * | 7/2005 | Miwa et al. | 313/506 |
| 2005/0224821 A1 * | 10/2005 | Sakano et al. | 257/79 |
| 2006/0113895 A1 * | 6/2006 | Baroky et al. | 313/501 |
| 2006/0132011 A1 * | 6/2006 | Shimizu et al. | 313/112 |
| 2006/0208260 A1 * | 9/2006 | Sakuma et al. | 257/76 |
| 2006/0267042 A1 * | 11/2006 | Izuno et al. | 257/100 |
| 2007/0085107 A1 | 4/2007 | Nitta et al. | |
| 2007/0228947 A1 | 10/2007 | Tanimoto et al. | |
| 2009/0267484 A1 | 10/2009 | Kasakura et al. | |
| 2011/0204389 A1 | 8/2011 | Kasakura et al. | |

FOREIGN PATENT DOCUMENTS

| | | |
|---|---|---|
| JP | 2002-314142 | 10/2002 |
| JP | 2005-019663 A | 1/2005 |
| JP | 2008-034833 A | 2/2008 |
| JP | 2008-516414 A | 5/2008 |

OTHER PUBLICATIONS

Japanese Office Action dated Feb. 28, 2012, with partial English translation.

* cited by examiner

*Primary Examiner* — Zandra Smith
*Assistant Examiner* — Lawrence Tynes, Jr.
(74) *Attorney, Agent, or Firm* — McGinn IP Law Group, PLLC

(57) ABSTRACT

A light emitting device includes a light emitting element, a sealing material for sealing the light emitting element, a first filler included in the sealing material, and a second filler included in the sealing material. The second filler includes a particle diameter smaller than that of the first filler.

20 Claims, 4 Drawing Sheets

LIGHT EMITTING DEVICE

The present application is based on Japanese patent application No. 2008-194903 filed on Jul. 29, 2008, the entire contents of which are incorporated herein by reference.

BACKGROUND OF THE INVENTION

1. Field of the Invention

This invention relates to a light emitting device that a light emitting element is sealed with a sealing member.

2. Description of the Related Art

A light emitting device is disclosed which is composed of a light emitting device for emitting a primary light, silicone formed to cover a light emitting element and having a hardness of more than 50 in JISA value, and a phosphor for absorbing the primary light and emitting a visible light (See JP-A-2002-314142).

However, the light emitting device of JP-A-2002-314142 has the problem that stress applied to an electrical connection member such as wires becomes relatively large since it uses the sealing resin with a relatively high hardness. In other words, the large stress applied to the electrical connection member may cause wire disconnection when it is used under severe conditions. Thus, it is desirable to reduce the stress applied to the electrical connection member.

SUMMARY OF THE INVENTION

It is an object of the invention to provide a light emitting device can secure a strength in a sealing part for a light emitting element while using a relatively low hardness sealing resin.

(1) According to one embodiment of the invention, a light emitting device comprises:
  a light emitting element;
  a sealing material for sealing the light emitting element;
  a first filler included in the sealing material; and
  a second filler included in the sealing material,
  wherein the second filler comprises a particle diameter smaller than that of the first filler.

In the above embodiment (1), the following modifications, changes and a combination thereof can be made.
  (i) The first filler and the second filler comprises $SiO_2$, and the sealing material comprises silicone.
  (ii) The light emitting device further comprises:
  a third filler included in the sealing material,
  wherein the third filler comprises a particle diameter smaller than that of the second filler.
  (iii) The third filler comprises a thickener.
  (iv) The light emitting device further comprises:
  a phosphor included in the sealing material,
  (v) The first filler comprises an average particle diameter greater than a peak wavelength of the light emitting element, and
  the second filler comprises an average particle diameter smaller than a peak wavelength of the light emitting element.
  (vi) The sealing material comprises a shore hardness A of not more than 60.
  (vii) The sealing material comprises a shore hardness A of less than 50.
  (viii) The first filler and the second filler comprise a refractive index close to that of the sealing material.
  (ix) The sealing material comprises a plurality of sealing materials, and
  a first sealing material of the plurality of sealing materials closest to the light emitting element comprises a hardness lower than that of a second sealing material of the plurality of sealing materials formed outside the first sealing material.

POINTS OF THE INVENTION

According to one embodiment of the invention, a light emitting device is constructed such that it uses a sealing material with a relatively low shore hardness A. Therefore, stress applied to wires for wire bonding can be relatively small such that wire disconnection can be prevented even when the device is used under severe conditions. Further, the sealing material includes fillers. Thereby, the apparent hardness of the sealing material increases to secure the strength of the sealing material, so that the damage of an LED chip, wires etc. due to external force can be prevented.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

First Embodiment

Figure 1:
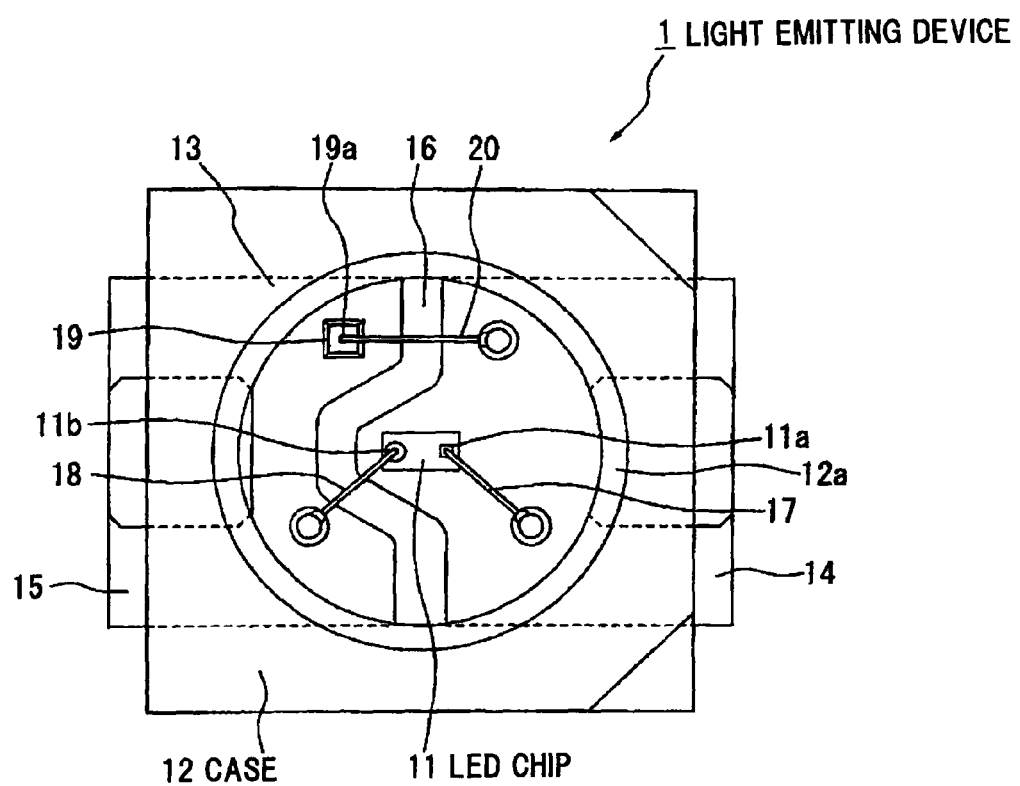
FIG. 1 is a top view showing a light emitting device in a first preferred embodiment according to the invention.
Figure 2:
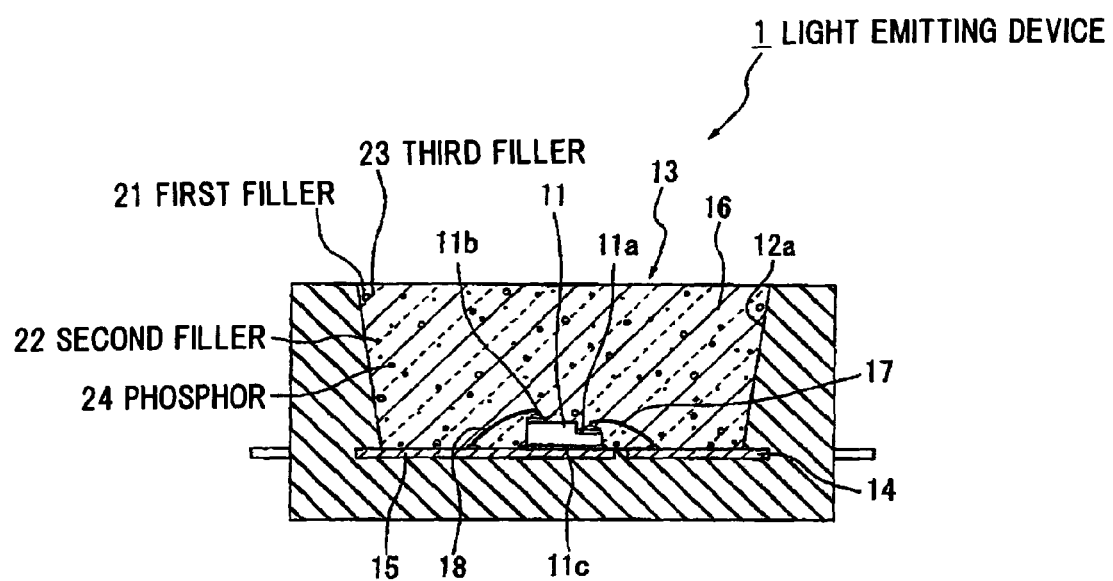
FIG. 2 is a cross sectional view showing the light emitting device of the first embodiment.

FIGS. 1 and 2 show a light emitting device of the first embodiment, where FIG. 1 is a top view showing the light emitting device and FIG. 2 is a cross sectional view showing the light emitting device.

As shown in FIG. 1, the light emitting device 1 is composed of an LED (light-emitting diode) chip 11, a case 12 of a resin material and with a concave portion 13 that includes a reflector portion 12a surrounding the LED chip 11, a first lead 14 and a second lead 15 that are exposed at the bottom of the concave portion 13 of the case 12 and disposed separately from each other in the horizontal direction, and a sealing material 16 that is filled in the concave portion 13 and formed of a resin. The light emitting device 1 is further composed of a first wire 17 for connecting one electrode 11a with the first lead 14, a second wire 18 for connecting the other electrode with the second lead 15, a Zener diode 19 as a protective element, and a third wire 20 for connecting an electrode 19a formed on the Zener diode 19 with the first lead 14. The wires 17, 18 and 20 are of gold.

The case 12 is formed nearly a rectangular solid as a whole, where the leads 14 and 15 form a part of the bottom of the concave portion 13 and the resin material of the case 12 forms the other part of the bottom of the concave portion 13. The leads 14, 15 extend to an outside of the case 12 where they are each electrically connected to an external connection terminal (not shown). The case 12 is formed of, e.g., a thermoplastic such as a liquid crystal polymer (LCP), polyphenylene sulfide (PPS), syndiotactic polystyrene (SPS), polyphthalamide (PPA), nylon etc. The leads 14, 15 and the case 12 are formed by transfer molding, injection molding etc.

An opening of the concave portion 13 is formed circular (top view). The inside wall of the reflector portion 12a is formed expanding upwardly. The concave portion 13 is filled with the transparent sealing material 16 for sealing the LED chip 11, the Zener diode 19 and wires 17, 18 and 20. Light emitted from the LED chip 11 can be extracted from the concave portion 13.

The LED chip 11 is of a face-up type that pair of electrodes 11a, 11b are formed on the top surface side. In this embodiment, the LED chip 11 is composed of GaN based semiconductor and emits a blue light. The LED chip 11 is fixed to the first lead 14 by a die bonding paste 11c (See FIG. 2) of an epoxy based material.

The first lead 14 and the second lead 15 are formed of a conductive metal with silver plating. The first lead 14 and the second lead 15 has a predetermined thickness and a predetermined width, and ends thereof in the longitudinal direction are located inside the concave portion 13. The ends of the first lead 14 and the second lead 15 inside the concave portion 13 are disposed isolated from each other at the concave portion 13.

FIG. 2 is a cross sectional view showing the light emitting device.

As shown in FIG. 2, the sealing material 16 is filled in the concave portion 13 for sealing the LED chip 11, the Zener diode 19 and the wires 17, 18 and 20. In this embodiment, the sealing material 16 is formed of an elastomer type silicone based resin which is not liable to cause yellowing due to heat, light etc. as compared to epoxy based resins. The sealing material 16 is preferably not more than 60 in shore hardness A and more preferably less than 50 in shore hardness A in consideration of stress applied to the wires 17, 18 and 20.

The sealing material 16 is filled in the concave portion 13 after the LED chip 11 is mounted on the first lead 14 and the Zener diode 19 is mounted on the second lead 15. The method for filling the sealing material 16 thereinto is arbitrary insofar as the LED chip 11, the Zener diode 19 and the wires 17, 18 and 20 can be sealed with the sealing material 16, and it can be conducted by potting etc. After the sealing material 16 is filled in the concave portion 13, it is hardened under a predetermined condition. The sealing material 16 may be ultraviolet curable or heat curable, and preferably heat curable in consideration of conditions for device production facility. In this embodiment, the sealing material 16 is of silicone with a shore hardness A of 40 and is cured under temperature conditions, 150° C. and 1 hour.

The sealing material 16 includes a first filler 21, a second filler 22 and a third filler 23 that are different each other in particle diameter. The shape of the fillers 21, 22 and 23 may be arbitrary and, e.g., a sphere, a scale, a bar, a fiber etc. Also, the material of the fillers 21, 22 and 23 may be arbitrary and, e.g., an inorganic material such as silica, glass and talc or a resin material. The fillers 21, 22 and 23 are preferably of a material not deteriorated even at 150° C. or more in consideration of the production conditions, performance etc. of the light emitting device 1. In this embodiment, the fillers 21, 22 and 23 are of silica ($SiO_2$) with a refractive index relatively close to that of the sealing material 16 of silicone.

The first filler 21 is 10 to 30 μm in average particle diameter ($d_{50}$) and included at a rate of 10 to 20% by weight in the sealing material 16. The second filler 22 is 0.1 to 1.0 μm in average particle diameter ($d_{50}$) and included at a rate of 5 to 20% by weight in the sealing material 16. The third filler 23 is 0.01 to 0.04 μm in average particle diameter ($d_{50}$) and included at a rate of 0.5 to 2.0% by weight in the sealing material 16. The second filler 22 and the third filler 23 are in average particle diameter preferably shorter than the peak wavelength of the LED chip 11, and in maximum particle diameter preferably shorter than the emission wavelength of the LED chip 11.

For example, in this embodiment, the first filler 21 is 20 μm in average particle diameter and included at a rate of 13% by weight in the sealing material 16. The second filler 22 is 0.3 μm in average particle diameter and included at a rate of 9% by weight in the sealing material 16. The third filler 23 is 0.01 μm in average particle diameter and included at a rate of 1% by weight in the sealing material 16.

In this embodiment, the fillers 21, 22 and 23 are dispersed uniformly in the sealing material 16. Thereby, the various functions of the fillers 21, 22 and 23 can be effected sufficiently. The method for mixing the fillers 21, 22 and 23 into the sealing material 16 can be a mixing method using a mixer, extruder, injection molder etc. or a kneading method using a triple roll mill etc. Optionally, a dispersing material may be included in the sealing material 16 in order to improve the dispersivity of the filler 21, 22 and 23 in the sealing material 16.

The sealing material 16 further includes a phosphor 24 for emitting a light with a wavelength different from an excitation light when being excited by the excitation light emitted from the LED chip 11. In this embodiment, the phosphor 24 may be a yellow phosphor of YAG (yttrium aluminum garnet) or silicates for converting blue light emitted from the LED chip 11 into yellow light. The phosphor 24 may be arbitrarily altered in composition and emission wavelength and dispersed or sunk. FIG. 2 illustrates that the phosphor 24 is uniformly dispersed in the sealing material 16. The phosphor 24 is 10 to 30 μm in average particle diameter ($d_{50}$) and included at a rate of 5.0 to 20% by weight in the sealing material 16. A dispersing material may be included in the sealing material 16 in order to improve the dispersivity of the phosphor 24 in the sealing material 16. For example, in this embodiment, the phosphor 24 is 17 μm in average particle diameter ($d_{50}$) and included at a rate of 6% by weight in the sealing material 16.

Effects of the First Embodiment

The light emitting device 1 thus constructed uses the sealing material 16 with a relatively low shore hardness A. Therefore, stress applied to the wires 17, 18 and 20 can be relatively small such that wire disconnection can be prevented even when the device is used under severe conditions. Further, the sealing material 16 includes the fillers 21, 22 and 23. Thereby, the apparent hardness of the sealing material 16 increases to secure the strength of the sealing material 16, so that the damage of the LED chip 11, the wires 17, 18 and 20 etc. due to external force can be prevented.

Further, the second filler 22 and the third filler 23 with a particle diameter smaller than that of the first filler 21 are included in the sealing material 16. Thereby, the gas barrier property of the sealing material 16 can be significantly enhanced which may be insufficient when using only the first filler 21 with a large particle diameter. Further, the third filler 23 with a particle diameter smaller than that of the second filler 22 is included in the sealing material 16. Thereby, the viscosity of the sealing material 16 can be enhanced which may be insufficient when using only the second filler 22. In other words, the third filler 23 functions as a thickener or viscosity improver. Thus, in this embodiment, the first filler 21 and the second filler 22 contribute to improving the viscosity of the sealing material 16, the second filler 22 and the third filler 23 contribute to improving the gas barrier property of the sealing material 16, and the third filler 23 contributes to improving the viscosity of the sealing material 16.

As described above, the light emitting device 1 of the embodiment is constructed such that the fillers with different particle diameters included in the sealing material 16 allow improvement in apparent hardness and gas barrier property of the sealing material 16 even when it uses the sealing material with relatively low hardness.

The light emitting device 1 of the embodiment is constructed such that the fillers 21, 22 and 23 has a refractive index relatively close to that of the sealing material 16 of silicone. Thereby, optical influence caused by adding the fillers 21, 22 and 23 thereto can be sufficiently reduced. In addition, since the average particle diameter of the second filler 22 and the third filler 23 is set to be smaller than the peak wavelength of the LED chip 11, optical interference caused by the second filler 22 and the third filler 23 can be sufficiently reduced.

Modifications

Although in the first embodiment the sealing material 16 includes the phosphor 24 for wavelength converting a part of light emitting the LED chip 11, it may include no phosphor. Although the LED chip 11 emits blue light, it may emit green light or red light. The light emitting device 1 may include three blue, green and red LED chips each mounted on separate leads in order to radiate white light. Although the LED chip 11 is formed of GaN based semiconductor, it may be formed of the other semiconductor such as ZnSe or SiC based material.

Figure 3:
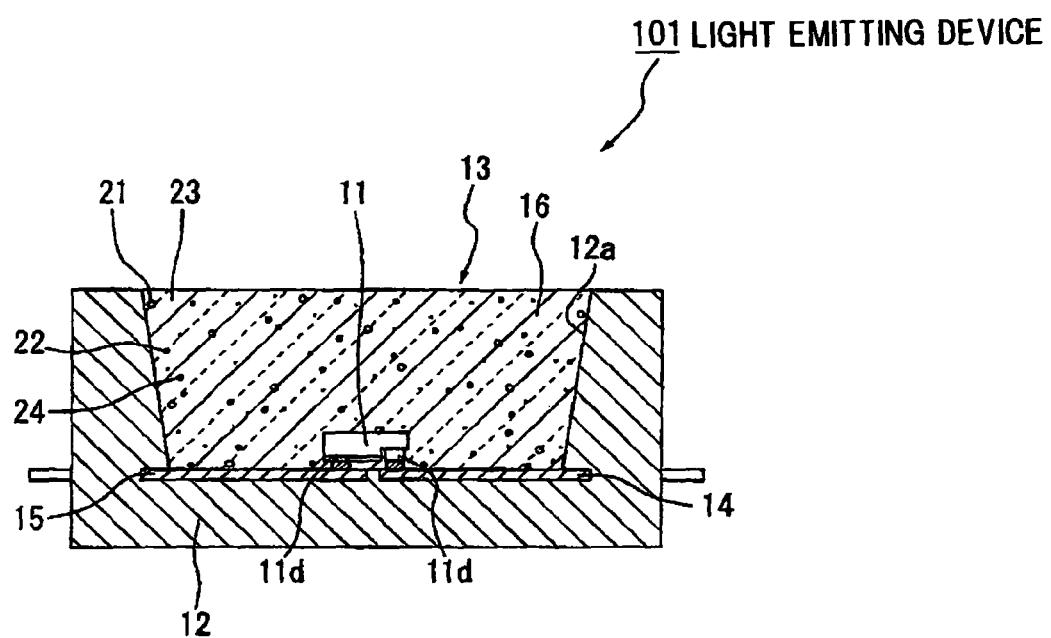
FIG. 3 is a cross sectional view showing a light emitting device in a modification according to the invention.

In the first embodiment the light emitting device 1 uses the LED chip 11 of face-up type. However, as shown in FIG. 3, a light emitting device 101 may be formed that uses an LED chip 11 of flip-chip type.

Figure 4:
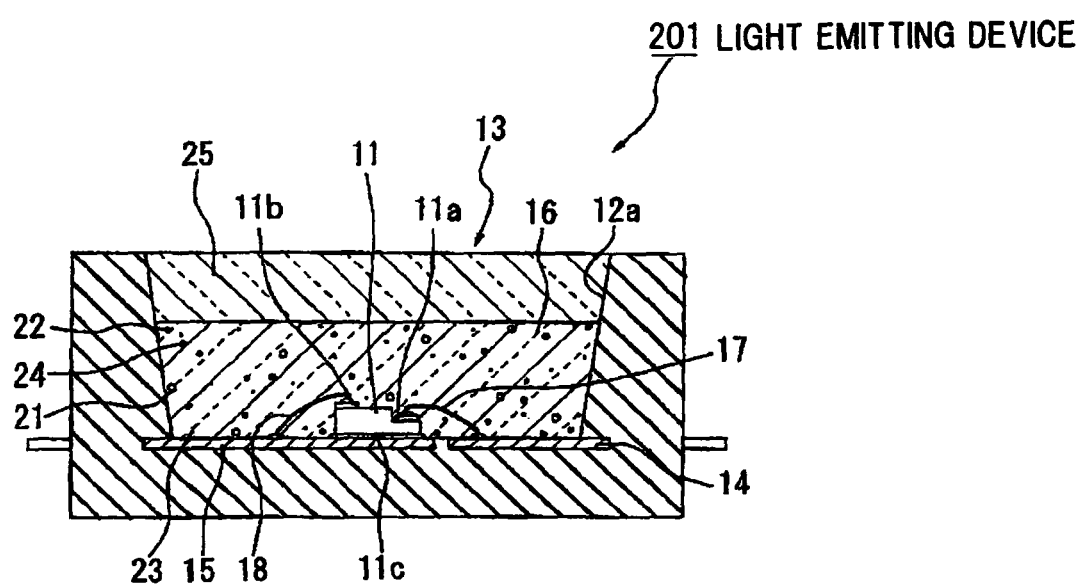
FIG. 4 is a cross sectional view showing a light emitting device in another modification according to the invention.

In the first embodiment only one sealing material 16 is formed. Alternatively, as shown in FIG. 4, plural sealing materials 16 and 17 may be formed. In FIG. 4, a light emitting device 201 is composed of a first sealing material 16 for directly sealing the LED chip 11 and a second sealing material 25 formed outside the first sealing material 16 such that the first sealing material 16 and the second sealing material 25 are formed in multilayer in the concave portion 13. The sealing material for the LED chip 11 may include three or more sealing materials. The first sealing material 16 includes the fillers 21, 22 and 23 and the phosphor 24 as the sealing material 16 in the first embodiment. The second sealing material 25 is formed of silicone with the same hardness as the first sealing material 16 such that stress is not liable to occur at the interface between them. The second sealing material 25 may be formed of silicone with a hardness higher than the first sealing material 16 such that it can have an increased hardness without using the fillers. The material of the sealing material 16 may be arbitrary and, e.g., a transparent resin such as epoxy resin or an inorganic material such as glass.

In the first embodiment the top-view type light emitting device 1 is embodied. However, the invention may be also applied to a side-view type, a COB (chip on board) type, or bullet type light emitting device.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting device, comprising:
    a light emitting element;
    a sealing material for sealing the light emitting element;
    a first filler included in the sealing material; and
    a second filler included in the sealing material,
    wherein the second filler comprises a particle diameter less than a particle diameter of the first filler, and
    wherein the first and second fillers are a non-fluorescent material.

2. The light emitting device according to claim 1, wherein the first filler and the second filler comprises $SiO_2$, and
    wherein the sealing material comprises silicone.

3. The light emitting device according to claim 2, further comprising:
    a third filler included in the sealing material,
    wherein the third filler comprises a particle diameter less than a particle diameter of the second filler.

4. The light emitting device according to claim 3, wherein the third filler comprises a thickener.

5. The light emitting device according to claim 4, further comprising:
    a phosphor included in the sealing material.

6. The light emitting device according to claim 5, wherein the first filler comprises an average particle diameter greater than a peak wavelength of the light emitting element, and
    wherein the second filler comprises an average particle diameter less than a peak wavelength of the light emitting element.

7. The light emitting device according to claim 3, wherein the third filler comprises an average particle diameter ($d_{50}$) of 0.01 to 0.04 μm.

8. The light emitting device according to claim 3, wherein the first filler comprises an average particle diameter ($d_{50}$) of 10 to 30 μm,
    wherein the second filler comprises an average particle diameter ($d_{50}$) of 0.1 to 1.0 μm, and
    wherein the third filler comprises an average particle diameter ($d_{50}$) of 0.01 to 0.04 μm.

9. The light emitting device according to claim 1, wherein the sealing material comprises a shore hardness A of not more than 60.

10. The light emitting device according to claim 1, wherein the sealing material comprises a shore hardness A of less than 50.

11. The light emitting device according to claim 1, wherein the first filler and the second filler comprise a refractive index close to a refractive index of the sealing material.

12. The light emitting device according to claim 1, wherein the sealing material comprises a plurality of sealing materials, and
    wherein a first sealing material of the plurality of sealing materials closest to the light emitting element comprises a hardness lower than a hardness of a second sealing material of the plurality of sealing materials formed outside the first sealing material.

13. The light emitting device according to claim 1, wherein the first filler comprises an average particle diameter ($d_{50}$) of 10 to 30 μm.

14. The light emitting device according to claim 13, wherein the first filler is included in a range from 10 to 20% by weight in the sealing material.

15. The light emitting device according to claim 8, wherein the first filler is included in a range from 10 to 20% by weight in the sealing material, the second filler is included in a range from 5 to 20% by weight in the sealing material and the third filler is included in a range from 0.5 to 2.0% by weight in the sealing material.

16. The light emitting device according to claim 1, wherein the second filler comprises an average particle diameter ($d_{50}$) of 0.1 to 1.0 μm.

17. The light emitting device according to claim 16, wherein the second filler is included in a range from 5 to 20% by weight in the sealing material.

18. The light emitting device according to claim 1, wherein the fillers are dispersed uniformly in the sealing material.

19. The light emitting device according to claim 1, wherein the sealing material includes a dispersing material.

20. The light emitting device according to claim 1, wherein the first filler comprises a bar shape.

* * * * *